US009602110B1

(12) United States Patent
Caffee

(10) Patent No.: US 9,602,110 B1
(45) Date of Patent: Mar. 21, 2017

(54) OSCILLATOR AMPLIFIER BIASING TECHNIQUE TO REDUCE FREQUENCY PULLING

(71) Applicant: Silicon Laboratories Inc., Austin, TX (US)

(72) Inventor: Aaron J. Caffee, Scappoose, OR (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/963,462

(22) Filed: Dec. 9, 2015

(51) Int. Cl.
*H03L 1/02* (2006.01)

(52) U.S. Cl.
CPC ..................... *H03L 1/02* (2013.01)

(58) Field of Classification Search
CPC . H03L 7/085; H03L 7/099; H03L 1/02; H03L 1/025; H03L 1/026
USPC .......................................................... 331/176
See application file for complete search history.

(56) References Cited

U.S. PATENT DOCUMENTS

| | | | | |
|---|---|---|---|---|
| 4,906,944 A | * | 3/1990 | Frerking | ............... H03L 7/181 331/1 A |
| 5,081,431 A | * | 1/1992 | Kubo | .................. H03L 1/026 331/116 R |
| 5,182,528 A | * | 1/1993 | Zuta | ..................... H03L 7/02 331/1 A |
| 7,525,392 B2 | | 4/2009 | Tarng | |
| 9,356,606 B2 | | 5/2016 | Caffee | |
| 2002/0011902 A1 | | 1/2002 | Ipek et al. | |
| 2003/0197567 A1 | * | 10/2003 | Villella | ................ H03L 1/026 331/158 |
| 2013/0320955 A1 | | 12/2013 | Kratyuk et al. | |
| 2014/0176251 A1 | | 6/2014 | Seth et al. | |
| 2015/0145607 A1 | | 5/2015 | Caffee | |
| 2015/0285691 A1 | | 10/2015 | Caffee et al. | |

\* cited by examiner

*Primary Examiner* — Jeffrey Shin
(74) *Attorney, Agent, or Firm* — Zagorin Cave LLP

(57) ABSTRACT

An oscillator amplifier biasing technique configures an oscillator amplifier to operate at a bias point causing loading on a tank circuit to have reduced or negligible dependence on amplifier bias conditions or device characteristics. The bias signal level may vary with variation in temperature. The oscillator amplifier biasing technique includes determining a bias signal level that has a minimum sensitivity of the frequency of oscillation as a function of temperature. The technique may store associated data in non-volatile memory to describe the bias signal level dependence on temperature. A digital-to-analog converter may drive the bias signal of the oscillator to the minimum sensitivity point as a function of temperature. The technique may substantially reduce effects of up-conversion of flicker noise in the oscillator output signal as well as improve frequency accuracy in the presence of effects such as mechanical strain and/or aging.

21 Claims, 6 Drawing Sheets

OSCILLATOR AMPLIFIER BIASING TECHNIQUE TO REDUCE FREQUENCY PULLING

BACKGROUND

Field of the Invention

This invention relates to electronic devices and to oscillator circuits and more particularly to generating clock signals for electronic devices.

Description of the Related Art

In general, electronic oscillator circuits are used to generate repetitive oscillating electronic signals for a variety of integrated circuit applications (e.g., local oscillator signals for radio frequency mixers, transmitters for generating carrier waves for radio frequency signal transmission, etc.). Typical clock generator applications can tolerate little frequency error. Accordingly, external crystals may be used to generate precise mixing or carrier clock signals. Crystals are electromechanical devices that may be trimmed to resonate at a particular frequency. Use of a discrete crystal for a crystal oscillator increases printed circuit board area and system cost. The connections between an integrated circuit and the crystal may couple unwanted electromagnetic signals, thereby causing jitter in the resulting clock signal. In addition, the frequency of the clock signal may vary unpredictably due to changes in capacitance on pins coupled to the crystal caused by mechanical stresses on the pins.

Referring to FIG. 1, rather than use a crystal oscillator circuit, a clock generator circuit may use a conventional tank circuit, e.g., tank circuit 102, which is a tuned circuit including inductor 104 coupled to capacitor 106. Charge flows back and forth from the capacitor plates through the inductor so the tuned circuit can store electrical energy oscillating at its resonant frequency. Amplifier circuit 108 compensates for small losses in the tank circuit to sustain oscillation. By supplying a transconductance, $-G_m$, that is equal and opposite to the tank losses (modeled as $G_{loss}$), amplifier 108 is able to sustain oscillation indefinitely at the resonant frequency of the tank circuit and at an amplitude determined by the amplifier. Typically, that amplitude is based on the intrinsic limiting behavior of the amplifier. Accordingly, $-G_m$ should be interpreted as an effective transconductance presented to the tank circuit by the amplifier having an absolute value that monotonically decreases with increasing signal amplitudes for a particular bias condition. That is, the amplitude of signals within the oscillator will increase until the effective transconductance of the amplifier is equal and opposite to the tank circuit losses. In that open-loop approach, the amplifier contributes more loading and power to ensure sufficient excess gain under various environmental (temperature, strain, aging, etc.) and manufacturing (e.g., dielectric thickness, conductor thickness, charge carrier mobility, etc.) conditions to regenerate and sustain oscillation.

For oscillator applications that require low power for a particular performance level, the amplifier is typically biased to reduce or eliminate any excess gain. However, that amplifier bias point may vary as a function of environmental factors (e.g., temperature, strain, aging, etc.), causing the amplitude of the output signal to vary, and therefore, substantially degrade the oscillator performance. Automatic amplitude control techniques may be used to compensate for the effects of those environmental factors. Nevertheless, target performance (e.g., low power consumption for a particular amount of phase noise) may be difficult to achieve using conventional automatic amplitude control techniques. For example, flicker noise (i.e., 1/f noise) is low frequency noise that modulates the frequency of the oscillating signal. Frequency multiplication of the oscillator output signal in some applications (e.g., frequency synthesizers) upconverts the flicker noise and may cause the oscillator to operate outside of a target operating specification. Accordingly, improved oscillating signal generation techniques are desired.

SUMMARY OF EMBODIMENTS OF THE INVENTION

In at least one embodiment of the invention, an apparatus includes an oscillator circuit configured to generate a clock signal in response to an oscillator bias signal received on a bias node. The apparatus includes a bias signal generation circuit configured to generate the oscillator bias signal based on a sensed temperature code and a predetermined parameter describing a relationship between temperature and an oscillator bias signal level corresponding to a target frequency of oscillation of the clock signal. The predetermined parameter may be a temperature-bias signal code pair of a plurality of temperature-bias signal code pairs corresponding to the target frequency of oscillation. The predetermined parameter may be generated based on one or more coefficients for a Taylor polynomial describing the relationship between the oscillator bias signal level and temperature for the target frequency of oscillation. The bias signal generation circuit may include a storage element configured to store values associated with the relationship. The bias signal generation circuit may include a processor selectively configured to operate in a normal mode to provide an oscillator bias level code based on contents of the storage element and the sensed temperature code. The bias signal generation circuit may include a digital-to-analog converter circuit configured to provide the oscillator bias signal level corresponding to the oscillator bias level code. The bias signal generation circuit may include a temperature sensor in thermal contact with the oscillator circuit and configured to generate the sensed temperature code. The bias signal generation circuit may include a storage element configured to store values associated with the relationship. The bias signal generation circuit may include a processor selectively configured to operate in a calibration mode to determine the target frequency of oscillation and to determine the predetermined parameter describing the relationship between temperature and the oscillator bias signal level corresponding to the target frequency of oscillation based on values of a digital frequency code corresponding to a frequency of the clock signal and values of an oscillator bias level code corresponding to levels of the oscillator bias signal. The bias signal generation circuit may include a frequency counter configured to generate the digital frequency code corresponding to the frequency of oscillation and to provide the digital frequency code to the processor.

In at least one embodiment of the invention, a method includes generating a clock signal in response to an oscillator bias signal received on a bias node. The method includes generating the oscillator bias signal based on a sensed temperature code and a predetermined parameter describing a relationship between temperature and an oscillator bias signal level corresponding to a target frequency of oscillation. Generating the oscillator bias signal may include selecting an oscillator bias level code corresponding to the sensed temperature code from a plurality of temperature-bias code pairs corresponding to the target frequency of oscillation. Generating the oscillator bias signal may include using the sensed temperature code to evaluate a Taylor polynomial describing the relationship between the oscillator bias signal and temperature for the target frequency of oscillation. Generating the oscillator bias signal may include generating the sensed temperature code, providing an oscillator bias level code based on the sensed temperature code, and providing the oscillator bias signal level corresponding to the oscillator bias level code. The method may include storing values associated with the relationship, and selectively operating in a normal mode to provide an oscillator bias level code based on at least one of the stored values and the sensed temperature code. Selectively operating in the normal mode may include updating the target frequency of oscillation for the sensed temperature code based on a minimum rate of change of frequency with respect to change in oscillator bias signal level for the sensed temperature code. The method may include storing values of a digital frequency code corresponding to a frequency of the clock signal and values of an oscillator bias level code corresponding to stored values of the oscillator bias signal. The method may include selectively operating in a calibration mode to determine the target frequency of oscillation and to determine the predetermined parameter and the relationship between temperature and the oscillator bias signal level corresponding to the target frequency of oscillation based on stored values of the digital frequency code corresponding to the frequency of the clock signal and stored values of the oscillator bias level code corresponding to stored values of the oscillator bias signal.

In at least one embodiment of the invention, a method includes adjusting a temperature of an oscillator configured to generate a clock signal in response to an oscillator bias signal received on a bias node, the temperature being adjusted to have each predetermined temperature of a plurality of predetermined temperatures. The method includes determining, at each predetermined temperature of the plurality of predetermined temperatures, an oscillator frequency for each oscillator bias level code of a plurality of oscillator bias level codes. The method includes determining a target oscillation frequency code for each predetermined temperature of the plurality of temperatures. The target oscillation frequency code is based on a rate of change of the oscillator frequency as a function of rate of change of the oscillator bias signal level. The method includes generating parameters describing a relationship between temperature and oscillator bias signal levels based on the target oscillation frequency code for each predetermined temperature of the plurality of predetermined temperatures. Determining the target oscillation frequency code for each predetermined temperature may include determining a minimum rate of change of frequency with respect to change in oscillator bias signal level for each predetermined temperature.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

An oscillator amplifier biasing technique configures an oscillator amplifier to operate at a bias point causing loading on a tank circuit to have reduced or negligible dependence on amplifier bias conditions or device characteristics. The bias signal level may vary with variation in temperature. A polynomial description of a bias signal level as a function of temperature may be used to bias the oscillator in response to oscillator temperature change to reduce frequency pulling due to change in bias signal level. The oscillator amplifier biasing technique includes determining a bias signal level that has a minimum sensitivity of the frequency of oscillation as a function of temperature. The technique may store associated data in non-volatile memory to describe the bias signal level dependence on temperature. A digital-to-analog converter may drive the bias signal of the oscillator to the minimum sensitivity point as a function of temperature. The technique may substantially reduce effects of up-conversion of flicker noise in the oscillator output signal, reduce frequency pulling from supply variations and external electromagnetic forces, and improve frequency accuracy in the presence of effects such as mechanical strain and/or aging.

Figure 1:
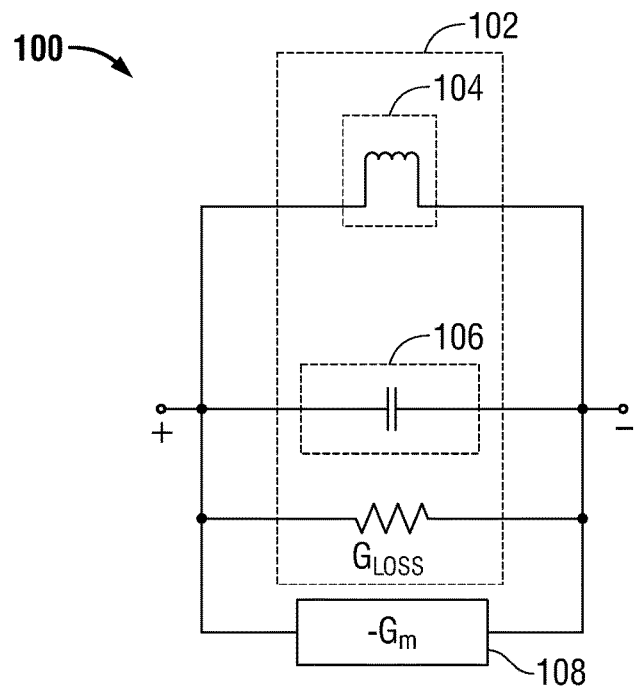
FIG. 1 illustrates a circuit model of a conventional LC oscillator.
Figure 2:
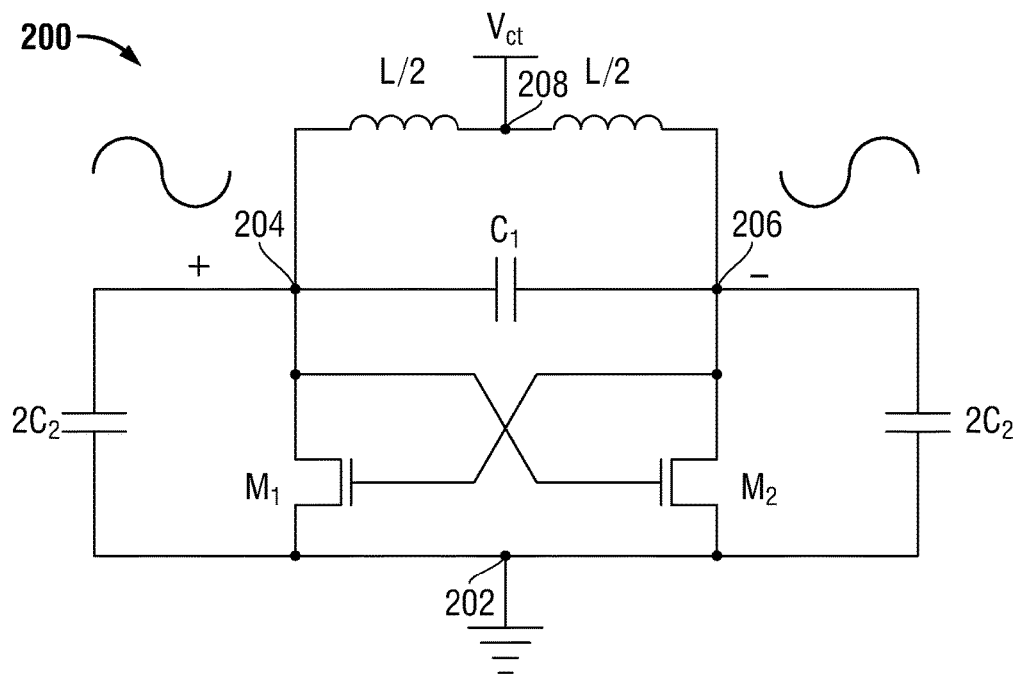
FIG. 2 illustrates a circuit diagram of a conventional LC oscillator circuit.

Referring to FIG. 2, LC oscillator 200 includes two tank inductors having a combined inductance L, multiple tank capacitors having a combined capacitance C, which represents the capacitance seen at the gates of an oscillator amplifier, and transistors M1 and M2, which form the oscillator amplifier having a negative transconductance. The tank capacitance C may include parasitic capacitance, fixed capacitance, variable capacitance, and/or other capacitances that may be predetermined or dynamically variable. Transistors M1 and M2 are cross-coupled n-type transistors that implement a negative transconductance, $-G_m$, that compensates for the conductive losses of the tank circuit, $G_{loss}$. If $|-G_m|=|G_{loss}|$ then the LC oscillator 200 sustains oscillations. In a typical LC oscillator, $G_{loss}$ varies and the amplifier is designed to have, at near zero amplitude, $|-G_m|$ that is typically greater than $|G_{loss}|$ by a factor of approximately two or more, resulting in a negative $G_{total}$, to ensure the proper amplitude growth at startup. The amplifier operates in the negative transconductance regime and generates an oscillating signal in the current domain that transitions from sinusoidal behavior to square wave behavior with an increase in a bias signal level, which may be provided to LC oscillator 200 at center tap node 208, at the positive oscillator terminal at node 204, or at node 202, e.g., using a tail current source (not shown) coupled between node 202 and ground. The oscillating signal has a fundamental frequency $f_0$ at the tank resonant frequency of the LC oscillator, but will also include harmonics. Those harmonics occur at frequencies higher than resonance and will be seen more by the capacitor than the inductor. Losses of the high frequency harmonics in the capacitor increase $G_{loss}$ and thus, those high frequency harmonics do not assist with sustaining oscillation.

The resonant frequency of the LC oscillator circuit is determined by the properties of the inductor and capacitor and is defined by the following relationship:

$$f_o = \frac{1}{2\pi\sqrt{LC}}$$

where L is the combined inductance of the tank inductors, C is the capacitance of the tank capacitors, and $f_o$ is the resonant frequency.

Figure 3:
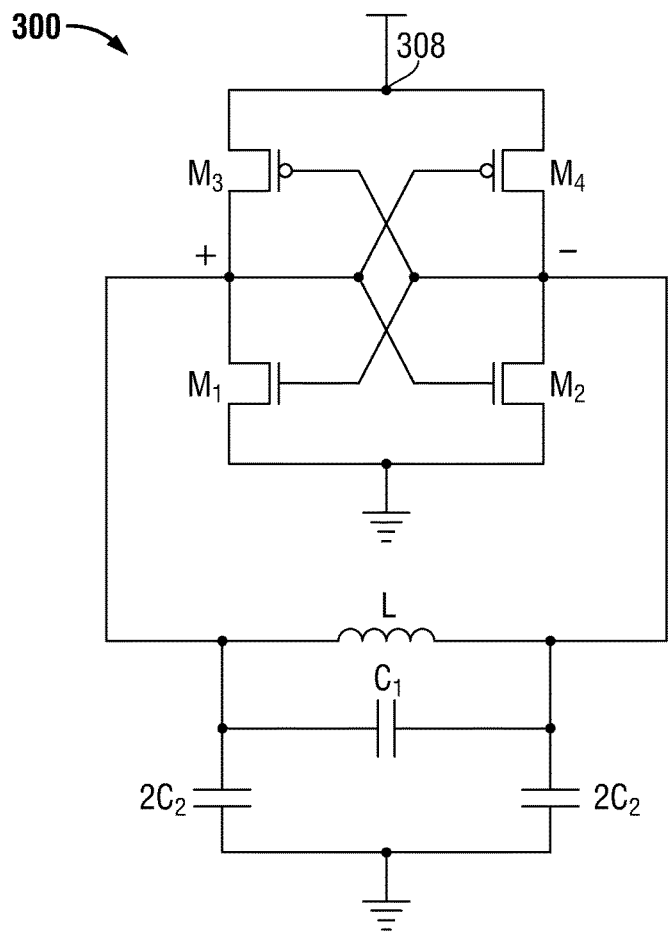
FIG. 3 illustrates a circuit diagram of a conventional LC oscillator circuit including a CMOS amplifier.
Figure 4:
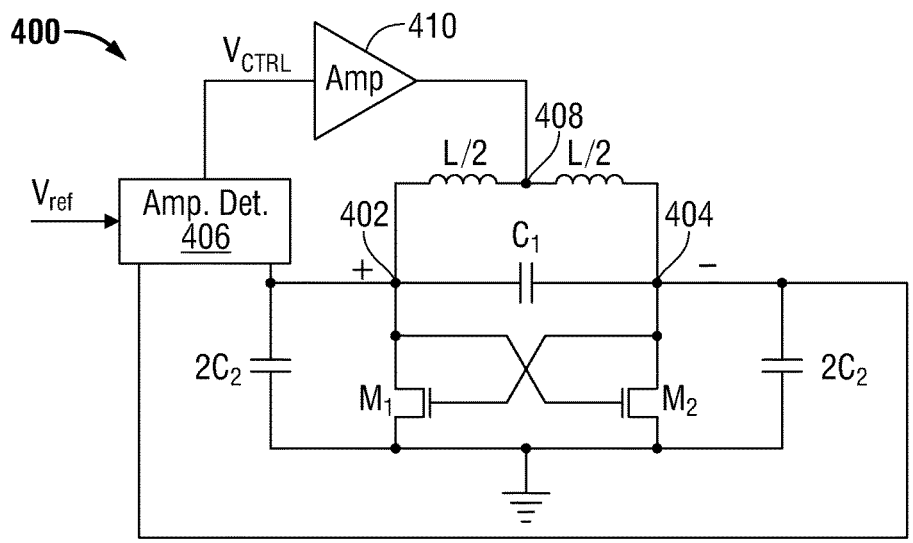
FIG. 4 illustrates a functional block diagram of an LC oscillator circuit coupled to an automatic amplitude control feedback circuit.

FIG. 3 illustrates another configuration of an LC oscillator including a CMOS amplifier. Direct control of amplifier biasing of oscillator 300 may use a regulated power supply coupled to node 308. Referring to FIG. 4, other techniques for determining amplifier bias may use indirect control of the amplifier bias. For example, an automatic amplitude control loop includes amplitude detector 406, which senses the peak amplitude of the oscillating signal. Amplifier 410 sets a bias signal voltage level for the oscillator amplifier (e.g., amplifier including transistors M1 and M2) via the center tap node 408 using amplitude reference voltage $V_{ref}$. Amplifier 410 may adjust the voltage on node 408, the center tap of the inductor, according to the peak amplitude of the oscillator output signal, which is detected by amplitude detector 406. For example, the amplitude of the oscillating signal varies as a function of temperature. As temperature increases, the negative feedback loop decreases $V_{CTRL}$ in response to an increased detected peak, thereby decreasing the oscillator bias signal level applied by amplifier 410 to the LC oscillator. Conversely, as temperature decreases, the negative feedback loop increases $V_{CTRL}$ in response to a decreased detected peak, thereby increasing the oscillator bias signal level applied by amplifier 410 to the LC oscillator.

Figure 5:
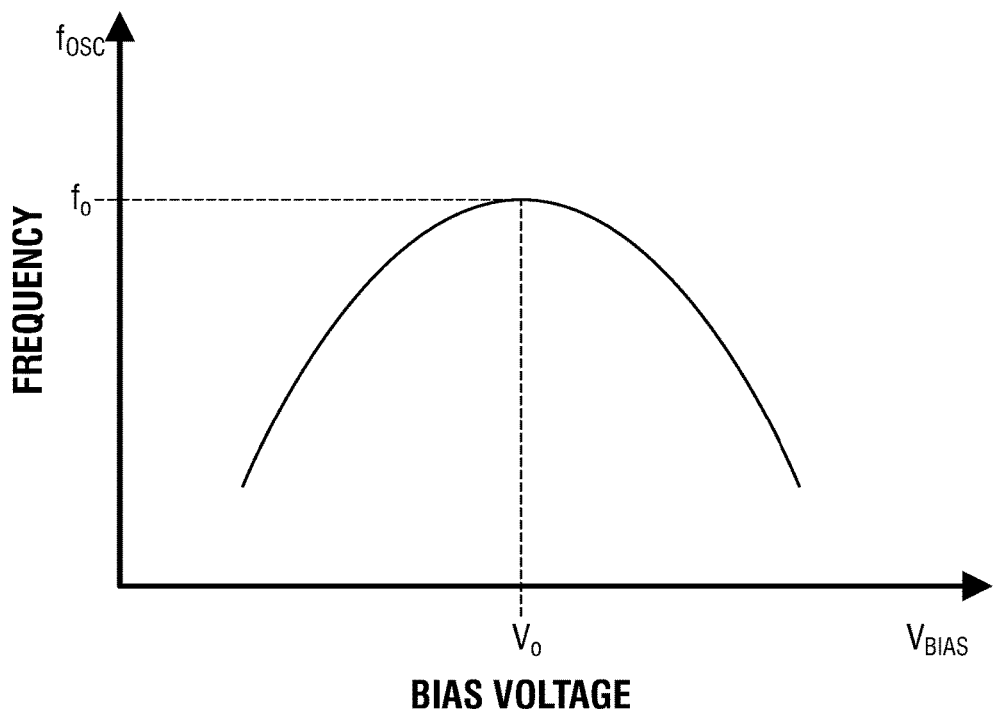
FIG. 5 illustrates a graphical representation of oscillator output signal frequency as a function of bias voltage for an exemplary oscillator circuit.

In general, the oscillator amplifier loads a tank circuit of an LC oscillator. Loading the tank circuit causes frequency pulling, i.e., causes variation of the frequency of the oscillator output signal. A change in the amplifier bias signal level changes the loading of the tank circuit and causes frequency pulling. Frequency pulling may cause unwanted up-conversion of flicker noise and sensitivity to environmental factors such as mechanical strain and aging. Referring to FIG. 5, for a particular oscillator temperature, the frequency of the oscillator output signal partially depends on the bias signal level of the oscillator amplifier. At some bias signal level, the frequency sensitivity (i.e., rate of change of the frequency of the oscillator output signal) has a minimum dependence on the biasing signal level (e.g., df/dV=0, where the bias signal is a bias voltage $V_0$) as indicated by the turning point of the function for the frequency of oscillation of the oscillator output signal as a function of bias signal level.

By selecting the bias signal level that corresponds to the frequency of oscillation within a specified range of frequencies that occurs at or near the function turning point (e.g., zero slope of the frequency of oscillation as a function of bias signal level curve) for a particular temperature of oscillator operation, the technique reduces the rate of change (i.e., sensitivity) the frequency of oscillation as a function of change to the bias signal level. That is, the technique reduces frequency pulling of the oscillator output signal. Where the bias signal is a voltage signal, the bias voltage level that corresponds to the frequency within the specification range of frequencies that occurs at or near the turning point (i.e., zero slope of the frequency as a function of bias voltage curve) for a particular temperature of oscillator operation reduces the frequency sensitivity to changes to the bias voltage level. Similarly, where the bias signal is a current, the bias current level that corresponds to the frequency within a specified range of frequencies that occurs at or near the turning point (e.g., zero slope of the frequency as a function of bias current curve) for a particular temperature of oscillator operation reduces the frequency sensitivity to changes to the bias current level. Selection of the bias signal level that corresponds to a reduced or minimum sensitivity frequency reduces the frequency pulling that is caused by amplifier bias dependence due to aging, mechanical strain, power supply variation, and electromagnetic interference.

Figure 6:
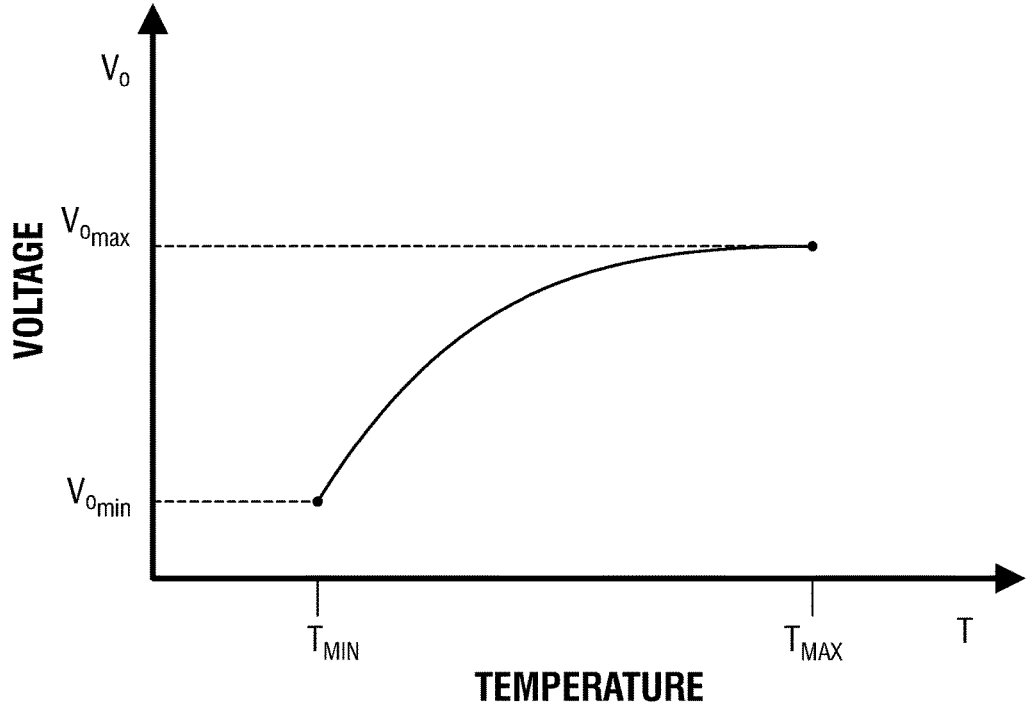
FIG. 6 illustrates a graphical representation of bias voltage as a function of oscillator temperature for an exemplary oscillator circuit.

Referring to FIG. 6, in some embodiments, the minimum frequency pulling sensitivity point is temperature dependent. To reduce frequency pulling of the oscillator output signal, the frequency variation as a function of temperature should also be considered when selecting a bias signal level. Accordingly, over a specified temperature range (i.e., where $T_{MIN}<T<T_{MAX}$), the technique to reduce frequency pulling determines a minimum frequency pulling sensitivity point for predetermined temperatures in the specified temperature range. The technique uses those values to generate bias code-temperature pairs that may be used to configure an oscillator for operation according to the temperature of the oscillator. Those bias code-temperature pairs may also be used to update the bias signal level of the oscillator in response to change in temperature of the oscillator.

Figure 7:
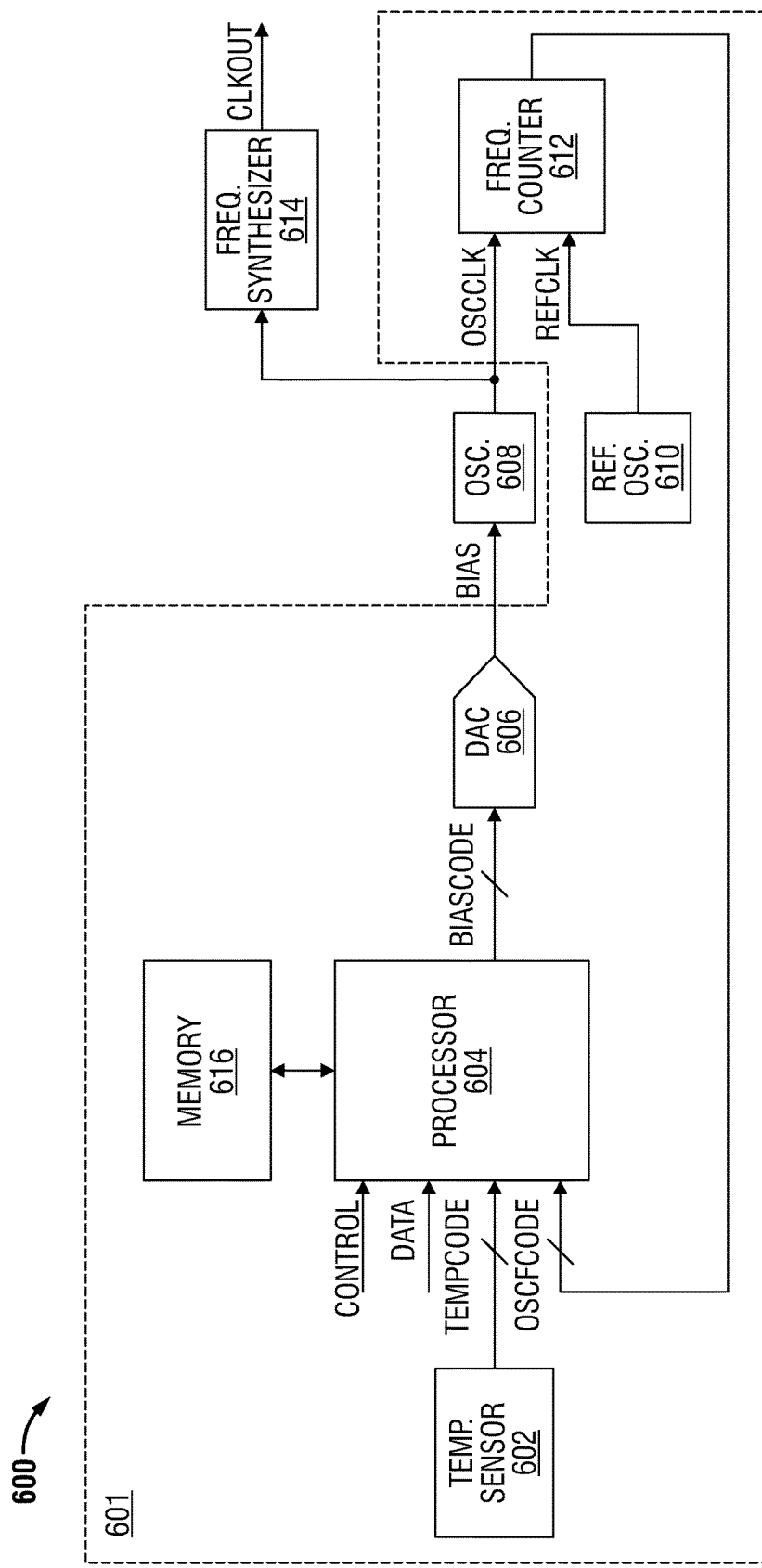
FIG. 7 illustrates a functional block diagram of an oscillator biasing system to reduce or eliminate frequency pulling consistent with at least one embodiment of the invention.

Referring to FIG. 7, oscillator system 600 includes bias signal generation circuit 601 configured to control the frequency dependence of the oscillator output signal as a function of bias signal level of oscillator 608, thereby reducing effects of flicker noise in a particular application. For example, bias signal generation circuit 601 reduces flicker noise in the oscillator output signal OSCCLK that may be observed in output clock signal CLKOUT by frequency synthesizer 614. Bias signal generation circuit 601 generates analog bias signal BIAS, which may be a current bias signal or a voltage bias signal that establishes a bias point of oscillator 608. Oscillator 608 may be an LC oscillator including a tank circuit (e.g., oscillator of FIGS. 1-4), an RC oscillator, a ring oscillator, or other oscillator circuit. Oscillator 608 may include an NMOS, PMOS, CMOS or Class C amplifier, as is known in the art of oscillator design. Analog bias signal BIAS may be a signal provided to bias the amplifier of oscillator 608. For example, analog bias signal may be provided as reference voltage $V_{ref}$ (or as a reference current) of the oscillator 400 of FIG. 4 or may be provided to node 204, 206, 208, 308, 402, 404, or 408 of a corresponding oscillator of FIGS. 1-4 described above. Referring back to FIG. 7, bias signal generation circuit 601 includes processor 604, which may include application-specific control logic or a general purpose processor configured to execute instructions fetched from memory 616. Processor 604 may configure oscillator system 600 in at least two modes of operation including a normal mode of operation and a calibration mode of operation. Oscillator system 600 may execute in a normal mode of operation upon power up of an integrated circuit including oscillator system 600 configured for a target application and/or during typical operation of oscillator system 600. Processor 604 may execute in a calibration mode of operation during production of an integrated circuit system including oscillator system 600. The mode of operation may be selectable by an integrated circuit processor coupled to oscillator system 600, by external user input (e.g., pin or terminal of the integrated circuit system), or by other suitable system mode selection technique.

Bias signal generation circuit 601 includes temperature sensor 602, which generates a digital representation of a sensed temperature TEMPCODE. Temperature sensor 602 may include a thermistor or other suitable integrated circuit temperature sensor. Exemplary temperature sensors are described in U.S. patent application Ser. No. 14/246,461, filed Apr. 7, 2014, entitled "Strain-Insensitive Temperature Sensor," naming Aaron J. Caffee et al. as inventors, which application is incorporated herein by reference.

Processor 604 may include an interface (e.g., control port CONTROL and data bus DATA, both of which may be bidirectional) compliant with any suitable communications standard to communicate control and data information between processor 604 and another system. For example, data may be transmitted externally from oscillator system 600 to another processor to determine Taylor coefficients from frequency, temperature, and bias signal information associated with oscillator 608. The coefficients may be determined using a polynomial fitting algorithm (e.g., least-mean squares) implemented in hardware, software, or combination thereof that may be executed during production test. The calculated coefficients may be stored in memory (e.g., non-volatile memory, which may include one or more of read-only memory, flash memory, ferroelectric random access memory, or other suitable memory) for access by processor 604. The interface may also be used to select a mode of operation, specify a target frequency or temperature range, or communicate other suitable information that may be used to configure or update bias signal generation circuit 601 or may be stored in memory 616 for later use by bias signal generation circuit 601. In general, the target frequency of oscillation is typically specified by a range of frequencies.

In at least one embodiment, processor 604 executes a sequence of instructions that are retrieved from memory 616, which may include non-volatile memory. Whether under external or internal control, processor 604 is configurable in a calibration mode of operation that sweeps through bias signal levels to determine how the frequency changes with changes to the bias signal level at a particular temperature. Bias signal generation circuit 601 may receive a digital code indicative of the actual frequency of the output signal OSCCLK from frequency counter 612. Frequency counter 612 determines an indicator of the actual frequency based on a reference clock REFCLK. Note that frequency counter 612 and reference oscillator 610 may be integrated with bias signal generation circuit 601 or may be external to bias signal generation circuit 601.

In response to the sensed temperature code TEMPCODE, processor 604 provides a bias level code BIASCODE. Processor 604 may access a data structure stored in memory 616. The data structure may store a set of temperature-bias signal code pairs including a bias signal code corresponding to each predetermined temperature value in a predetermined range of temperature values. Memory 616 may include a set of temperature-bias signal code pairs for each possible target frequency of oscillation in the predetermined range of possible target frequencies of oscillation. Processor 604 selects the set of temperature-bias signal code pairs according to a predetermined target frequency of oscillation and further selects one bias signal code from the set according to the sensed temperature code TEMPCODE. Digital-to-analog converter 606 generates an output analog bias signal BIAS having a level that corresponds to bias level code BIASCODE.

In other embodiments of oscillator system 600, rather than predetermined parameters describing the relationship between temperature and the oscillator bias signal level corresponding to a target frequency of oscillation of the clock signal being stored as one or more sets of temperature-bias signal code pairs, the relationship is embodied by stored coefficients of a Taylor series representation of a bias signal as a function of temperature for a particular target frequency of oscillation. Those coefficients may be predetermined during a calibration mode and may be determined by processor 604 or by other processor external to oscillator system 600 based on data generated by oscillator system 600. For example, processor 604 retrieves the one or more coefficients from memory 616 and computes bias level code BIASCODE based on the one or more coefficients and the sensed temperature code TEMPCODE. Digital-to-analog converter 606 generates an output analog bias signal BIAS having a level that corresponds to bias level code BIASCODE.

Figure 8:
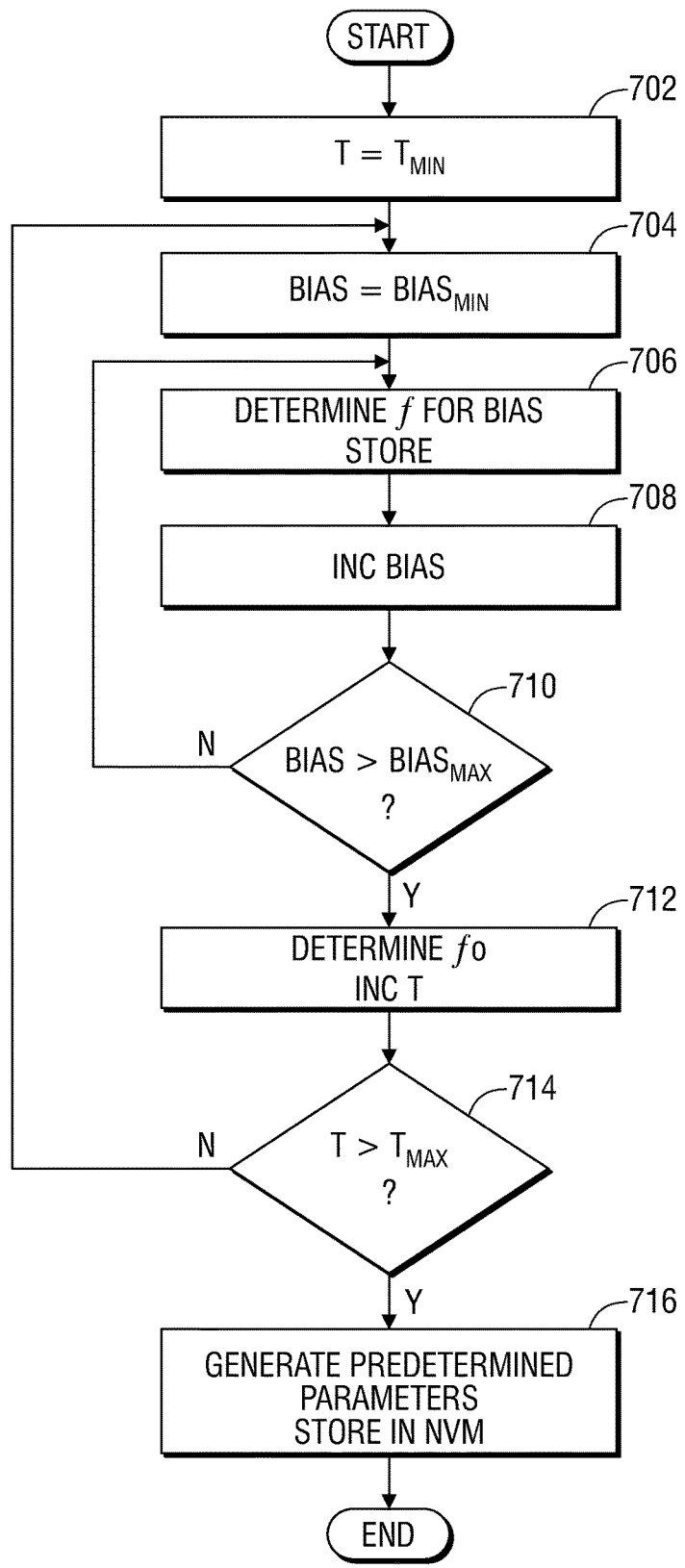
FIG. 8 illustrates information and control flows for a calibration mode operation of the oscillator biasing system of FIG. 7 consistent with at least one embodiment of the invention.

Referring to FIGS. 7 and 8, in at least one embodiment, oscillator system 600 executes an exemplary amplifier biasing calibration technique, e.g., in response to a control signal received on control port CONTROL. The amplifier biasing calibration technique may be executed in a production test environment or other environment that is able to control the temperature of oscillator 608 (e.g., using a controllable heater). Accordingly, calibration begins by setting the oscillator temperature to a minimum temperature $T_{MIN}$ of a target temperature range (i.e., where $T_{MIN}<T<T_{MAX}$) (702). Processor 604 sets the bias signal code BIAS to a minimum bias signal $BIAS_{MIN}$ in a range of predetermined bias signal codes (i.e., where $BIAS_{MIN}<BIAS<BIAS_{MAX}$) (704). Oscillator system 600 generates an output oscillator signal OSC-CLK. Frequency counter 612 generates a frequency measurement OSCFCODE based on the output oscillator signal OSCCLK and reference clock signal REFCLK and provides frequency measurement OSCFCODE to processor 604 (706). Processor 604 stores the value in memory 616 and/or sends it externally to another processor. In addition, temperature sensor 602 provides temperature code TEMPCODE, which corresponds to the temperature of oscillator 608 at the time each OSFCODE is measured, to processor 604. Processor 604 determines the next level of bias signal BIAS (e.g., by incrementing the value of bias signal code BIASCODE by a predetermined step size) (708). If bias signal BIAS is still within the predetermined range of bias signal levels (710), processor 604 continues to determine and provide frequency measurement OSCFCODE to processor 604 (706).

If the bias signal level exceeds the predetermined range of bias signal levels (710), processor 604 or other external processor uses bias signal code BIASCODE and frequency information to determine target frequency $f_0$, which is the frequency at which a change of the bias signal level causes a lowest or reduced change to the frequency of oscillation of output signal OSCCLK. After determining target resonant frequency $f_0$ or providing the information to an external system for determining target resonant frequency $f_0$, the amplifier biasing calibration technique increases the oscillator temperature (712). If the oscillator temperature is still within the predetermined temperature range (714), the amplifier biasing calibration technique determines the target resonant frequency $f_0$ for that next oscillator temperature in the predetermined range (704). If the oscillator temperature is outside the predetermined temperature range (714), processor 604 or other external system generates the predetermined parameters describing the relationship between oscillator temperature and oscillator bias signal levels for each predetermined target frequency of oscillation of a signal generated by oscillator 608 and stores the predetermined parameters in memory 616 (716).

Figure 9:
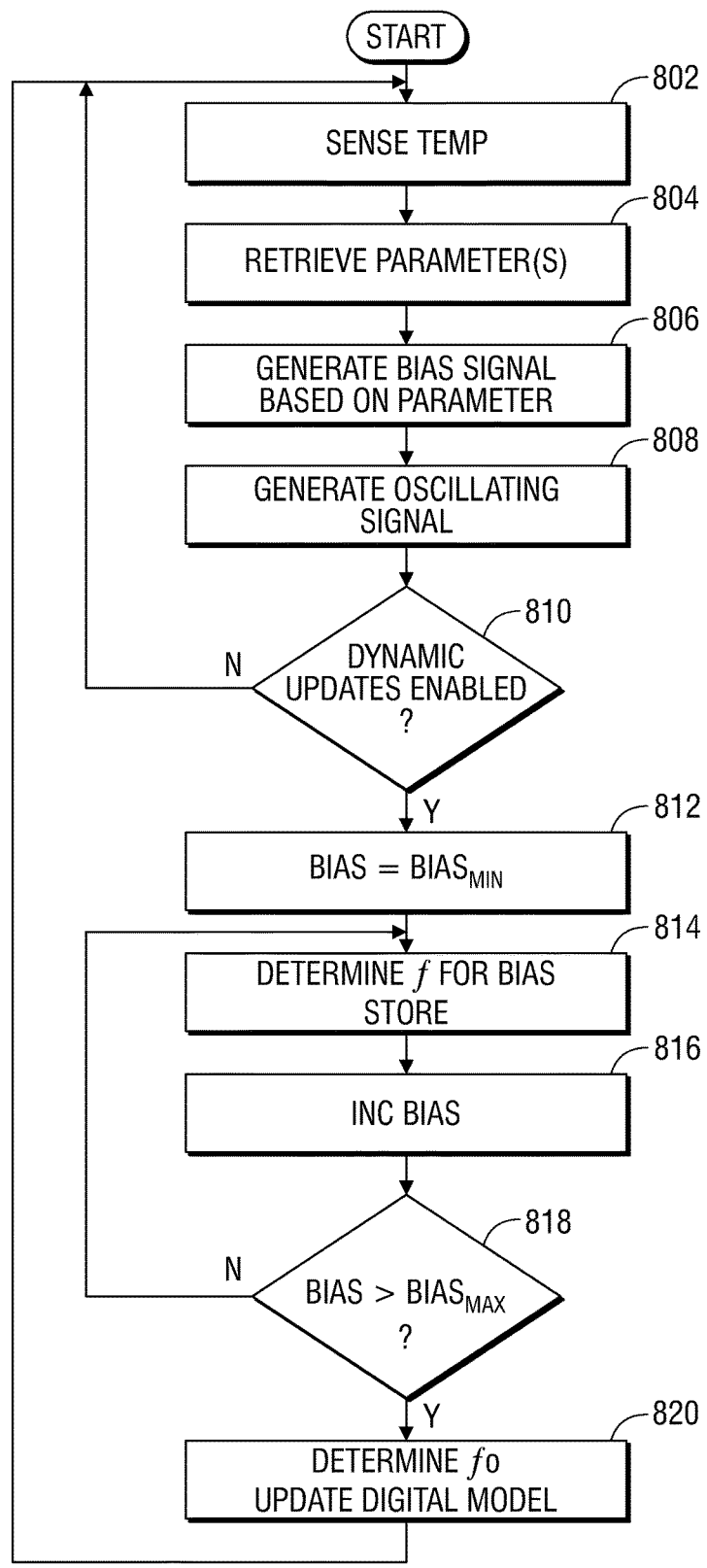
FIG. 9 illustrates information and control flows for a normal mode of operation of the oscillator biasing system of FIG. 7 consistent with at least one embodiment of the invention.

Referring to FIGS. 7 and 9, in at least one embodiment, oscillator system 600 executes an oscillator circuit biasing technique in a normal mode of operation, e.g., in response to a control signal received on control port CONTROL or an instruction executed on processor 604 and received from memory 616. The oscillator circuit biasing technique begins by sensing the temperature of oscillator 608 (802). For example, temperature sensor 602 is in thermal contact with oscillator 608 and generates sensed temperature TEMPCODE as described above. Processor 604 retrieves from memory 616 one or more predetermined parameters describing a relationship between oscillator temperature and an oscillator bias signal level corresponding to a target frequency of oscillation of the signal generated by oscillator 608 (804). Bias signal generation circuit 601 generates bias signal BIAS based on the predetermined parameter, e.g., by retrieving bias level code BIASCODE from memory 616 according to sensed temperature TEMPCODE, or evaluation of a polynomial using sensed temperature TEMPCODE and coefficients retrieved from memory 616 and generate analog signal based thereon, as described further above (806). Note that in embodiments using only temperature-independent parameters (e.g., coefficients in a polynomial implementation), sensing the temperature of oscillator 608 (802) may occur after retrieving parameters from memory. Those temperature-independent parameters may be fetched from memory only once, e.g., at the start of the technique or at system startup, and need not be re-fetched thereafter. Accordingly, retrieving the parameter(s) (804) may occur outside the feedback loop sequences of FIG. 9. Oscillator 608 generates oscillator signal OSCCLK using bias signal BIAS and provides oscillator signal OSCCLK to a target application (e.g., frequency synthesizer 614, which generates output clock signal CLKOUT) (808). Bias signal generation circuit 601 may be selectively configurable to perform dynamic updates (e.g., based on a control signal received from an external source over an interface or preconfigured by a control bit stored in a status register in memory 616).

If bias signal generation circuit 601 is not configured to perform dynamic updates (810), then bias signal generation circuit 601 may adapt to changing temperature by continuing to sense temperature (802) and updating the bias signal level accordingly. If bias signal generation circuit 601 is configured to perform dynamic updates (810), then at the current temperature, processor 604 may set the bias signal BIAS to a minimum bias signal level $BIAS_{MIN}$ in a range of predetermined bias signal levels (i.e., where $BIAS_{MIN} < BIAS < BIAS_{MAX}$) (812) and oscillator system 600 generates an output oscillator signal OSCCLK. Frequency counter 612 generates a frequency measurement OSCFCODE based on the output oscillator signal OSCCLK and reference clock signal REFCLK and may provide frequency measurement OSCFCODE to processor 604 (814). Processor 604 stores those values in memory 616 and/or sends those values externally to another processor. Processor 604 may determine the next value of bias signal BIAS (e.g., by incrementing the level of bias signal BIAS according to a predetermined step size between each bias level code BIASCODE) (816). If the bias signal level is still within the predetermined range of bias signal codes (818), processor 604 may continue to determine frequency measurement OSCFCODE and may provide the value to processor 604 (814). If the bias signal level exceeds the predetermined range of bias signal levels (818), processor 604 or other external processor uses the bias signal BIAS and frequency information to determine an updated target frequency $f_0$, which is the resonant frequency at which a change of the bias signal level has a minimum or reduced change to the frequency of oscillation of output signal OSCCLK for the sensed temperature TEMPCODE (820). Processor 604 updates the digital model, e.g., by storing a new target frequency and/or bias level code BIASCODE for sensed temperature TEMPCODE. After determining or providing the information to an external system for determining target frequency $f_0$, the amplifier biasing technique may continue to adaptively generate an oscillating signal based on the sensed temperature (802). Note that the information and control flows of FIGS. 8 and 9 are exemplary only and other sequences of operations that preserve any data dependencies are consistent with the description herein.

Thus, oscillator amplifier biasing techniques that reduce frequency pulling of an oscillator output signal based on bias signal variations have been described. Those techniques may improve flicker noise up-conversion and frequency accuracy of stand-alone oscillators. Structures described herein may be implemented using software executing on a processor (which includes firmware) or by a combination of software and hardware. Software, as described herein, may be encoded in at least one tangible computer readable medium. As referred to herein, a tangible computer-readable medium includes at least a disk, tape, or other magnetic, optical, or electronic storage medium.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example, while the invention has been described in an embodiment in which an LC oscillator is used, one of skill in the art will appreciate that the teachings herein can be utilized with other oscillator circuits (e.g., RC oscillators, MEMS oscillators, ring oscillators). Variations and modifications of the embodiments disclosed herein, may be made based on the description set forth herein, without departing from the scope and spirit of the invention as set forth in the following claims.

What is claimed is:

1. An apparatus comprising:
    an oscillator circuit configured to generate a clock signal in response to an oscillator bias signal received on a bias node; and
    a bias signal generation circuit configured to generate the oscillator bias signal based on a sensed temperature code and a predetermined parameter describing a relationship between temperature and an oscillator bias signal level corresponding to a target frequency of oscillation of the clock signal, the target frequency of oscillation being selected based on a rate of change of clock signal frequency as a function of the oscillator bias signal level.

2. The apparatus, as recited in claim 1, wherein the predetermined parameter is a temperature-bias signal code pair of a plurality of temperature-bias signal code pairs corresponding to the target frequency of oscillation.

3. The apparatus, as recited in claim 1, wherein the predetermined parameter is generated based on one or more coefficients for a Taylor polynomial describing the relationship.

4. The apparatus, as recited in claim 1, wherein the bias signal generation circuit comprises:
    a storage element configured to store values associated with the relationship; and
    a processor selectively configured to operate in a normal mode to provide an oscillator bias level code based on contents of the storage element and the sensed temperature code.

5. The apparatus, as recited in claim 4, wherein the bias signal generation circuit comprises:
    a digital-to-analog converter circuit configured to provide the oscillator bias signal level corresponding to the oscillator bias level code.

6. The apparatus, as recited in claim 1, wherein the bias signal generation circuit comprises:
    a temperature sensor in thermal contact with the oscillator circuit and configured to generate the sensed temperature code.

7. The apparatus, as recited in claim 1, wherein the bias signal generation circuit comprises:
    a storage element configured to store values associated with the relationship; and
    a processor selectively configured to operate in a calibration mode to determine the target frequency of oscillation and to determine the predetermined parameter based on values of a digital frequency code corresponding to a frequency of the clock signal and values of an oscillator bias level code corresponding to levels of the oscillator bias signal.

8. The apparatus, as recited in claim 7, wherein the bias signal generation circuit further comprises:
    a frequency counter configured to generate the digital frequency code and to provide the digital frequency code to the processor.

9. The apparatus, as recited in claim 1, wherein the target frequency of oscillation is selected based on a minimum of the rate of change.

10. A method comprising:
    generating a clock signal in response to an oscillator bias signal received on a bias node; and
    generating the oscillator bias signal based on a sensed temperature code and a predetermined parameter describing a relationship between temperature and an oscillator bias signal level corresponding to a target frequency of oscillation, the target frequency of oscillation being selected based on a rate of change of a frequency of the clock signal as a function of the oscillator bias signal level.

11. The method, as recited in claim 10, wherein generating the oscillator bias signal comprises selecting an oscillator bias level code corresponding to the sensed temperature code from a plurality of temperature-bias code pairs corresponding to the target frequency of oscillation.

12. The method, as recited in claim 10, wherein generating the oscillator bias signal comprises using the sensed temperature code to evaluate a Taylor polynomial describing the relationship.

13. The method, as recited in claim 10, wherein generating the oscillator bias signal comprises:
    generating the sensed temperature code;
    providing an oscillator bias level code based on the sensed temperature code; and
    providing the oscillator bias signal level corresponding to the oscillator bias level code.

14. The method, as recited in claim 10, further comprising:
    storing stored values associated with the relationship; and
    selectively operating in a normal mode to provide an oscillator bias level code based on at least one of the stored values and the sensed temperature code.

15. The method, as recited in claim 14, wherein the selectively operating in the normal mode comprises:
    updating the target frequency of oscillation based on a minimum rate of change of the frequency of the clock signal as a function of the oscillator bias signal level for the sensed temperature code.

16. The method, as recited in claim 10, further comprising:
    storing stored values of a digital frequency code corresponding to the frequency of the clock signal and stored values of an oscillator bias level code corresponding to levels of the oscillator bias signal; and
    selectively operating in a calibration mode to determine the target frequency of oscillation and to determine the predetermined parameter and the relationship based on stored values of the digital frequency code.

17. A method comprising:
    adjusting a temperature of an oscillator configured to generate a clock signal in response to an oscillator bias signal received on a bias node, the temperature being adjusted to have each predetermined temperature of a plurality of predetermined temperatures; and
    determining, at each predetermined temperature of the plurality of predetermined temperatures, an oscillator frequency for each oscillator bias level code of a plurality of oscillator bias level codes;
    determining a target oscillation frequency code for each predetermined temperature of the plurality of temperatures, the target oscillation frequency code being based on a rate of change of oscillator frequency as a function of an oscillator bias signal level; and
    generating parameters describing a relationship between temperature and the oscillator bias signal level based on the target oscillation frequency code for each predetermined temperature of the plurality of predetermined temperatures.

18. The method, as recited in claim 17, wherein determining the target oscillation frequency code for each predetermined temperature, comprises:
   determining a minimum rate of change of the oscillator frequency as a function of the oscillator bias signal level for each predetermined temperature.

19. The method, as recited in claim 17, wherein generating parameters comprises:
   generating a plurality of temperature-bias code pairs corresponding to the target oscillation frequency code for each predetermined temperature of the plurality of predetermined temperatures.

20. The method, as recited in claim 17, wherein generating parameters comprises:
   generating one or more coefficients for a Taylor polynomial describing the relationship.

21. The method, as recited in claim 17, further comprising:
   sensing a temperature to generate a sensed temperature code;
   generating the clock signal in response to the oscillator bias signal received on the bias node; and
   generating the oscillator bias signal based on the sensed temperature code and a parameter of the parameters corresponding to the sensed temperature code.

* * * * *